United States Patent
Gabl et al.

(10) Patent No.: US 8,638,025 B2
(45) Date of Patent: Jan. 28, 2014

(54) PIEZO ACTUATOR WITH EXTERNAL ELECTRODE SOLDERED TO OUTER FACE

(75) Inventors: Reinhard Gabl, St. Peter (AT); Franz Rinner, Deutschlandsberg (AT); Jan-Thorsten Reszat, Deutschlandsberg (AT); Markus Laussermayer, Wettmannstaetten (AT)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 13/023,819

(22) Filed: Feb. 9, 2011

(65) Prior Publication Data

US 2012/0019107 A1    Jan. 26, 2012

Related U.S. Application Data

(63) Continuation of application No. PCT/EP2009/060676, filed on Aug. 18, 2009.

(30) Foreign Application Priority Data

Aug. 18, 2008 (DE) .......................... 10 2008 038 227
Dec. 12, 2008 (DE) .......................... 10 2008 062 021

(51) Int. Cl.
  *H01L 41/083* (2006.01)
(52) U.S. Cl.
  CPC ............. *H01L 41/83* (2013.01); *H01L 41/838* (2013.01)
  USPC ........................................................ 310/328

(58) Field of Classification Search
  CPC .............................. H01L 41/83; H01L 41/838
  USPC .................................................... 310/328, 366
  See application file for complete search history.

(56) References Cited

U.S. PATENT DOCUMENTS

| | | | |
|---|---|---|---|
| 6,208,026 B1 | 3/2001 | Bindig et al. | |
| 6,260,248 B1 | 7/2001 | Cramer et al. | |
| 6,307,306 B1 * | 10/2001 | Bast et al. | 310/366 |
| 6,411,018 B1 * | 6/2002 | Heinz | 310/363 |
| 6,507,140 B1 * | 1/2003 | Heinz et al. | 310/366 |
| 6,522,052 B2 * | 2/2003 | Kihara et al. | 310/366 |
| 6,798,123 B2 * | 9/2004 | Bindig et al. | 310/364 |
| 7,276,837 B2 | 10/2007 | Boecking | |
| 7,276,841 B2 * | 10/2007 | Takaoka et al. | 310/363 |
| 7,429,817 B2 * | 9/2008 | Asano et al. | 310/364 |
| 7,439,655 B2 * | 10/2008 | Asano et al. | 310/328 |
| 7,477,002 B2 | 1/2009 | Florian | |
| 7,538,475 B2 * | 5/2009 | Ohmori et al. | 310/328 |
| 7,554,250 B2 * | 6/2009 | Kadotani et al. | 310/365 |
| 7,679,273 B2 * | 3/2010 | Oakley et al. | 310/328 |
| 2001/0033125 A1 * | 10/2001 | Takao et al. | 310/366 |

(Continued)

FOREIGN PATENT DOCUMENTS

| | | |
|---|---|---|
| DE | 33 30 538 A1 | 3/1985 |
| DE | 196 15 694 C1 | 7/1997 |

(Continued)

*Primary Examiner* — J. San Martin
(74) *Attorney, Agent, or Firm* — Slater & Matsil, L.L.P.

(57) ABSTRACT

A multilayer piezo actuator is specified, in which piezoelectric layers and electrode layers are arranged to form a stack. Electrical contact is made with the electrode layers via two external electrodes which consist of wires which are woven with one another. The external electrodes are in this case connected over their entire area to the side surfaces of the stack. A method is also specified for fitting an external electrode.

16 Claims, 3 Drawing Sheets

(56) References Cited

U.S. PATENT DOCUMENTS

| | | |
|---|---|---|
| 2002/0135275 A1 | 9/2002 | Heinz et al. |
| 2006/0022558 A1* | 2/2006 | Bindig et al. ............... 310/366 |
| 2006/0232172 A1* | 10/2006 | Asano et al. ............... 310/366 |
| 2007/0273251 A1 | 11/2007 | Okamura et al. |
| 2008/0007144 A1* | 1/2008 | Takei et al. ............... 310/364 |
| 2010/0230622 A1 | 9/2010 | Boecking |
| 2012/0024980 A1* | 2/2012 | Nakamura ............... 239/88 |

FOREIGN PATENT DOCUMENTS

| | | |
|---|---|---|
| DE | 197 53 930 A1 | 6/1999 |
| DE | 199 28 189 A1 | 4/2001 |
| DE | 199 45 267 C1 | 4/2001 |
| DE | 100 17 975 A1 | 10/2001 |
| DE | 100 26 635 A1 | 1/2002 |
| DE | 102 59 949 A1 | 7/2004 |
| DE | 103 24 871 A1 | 1/2005 |
| DE | 10 2004 004 7 | 8/2005 |
| DE | 10 2004 005 2 | 8/2005 |
| DE | 10 2005 035 1 | 3/2006 |
| DE | 10 2006 001 1 | 7/2007 |
| DE | 10 2006 000 536 A1 | 8/2007 |
| DE | 10 2006 018 0 | 10/2007 |
| DE | 10 2006 026 6 | 12/2007 |
| EP | 0 844 678 A1 | 5/1998 |
| EP | 1 808 908 A2 | 7/2007 |
| EP | 1 814 169 A2 | 8/2007 |
| JP | 05-079963 U | 10/1993 |
| JP | 2001-111126 A | 4/2001 |
| JP | 2002-261339 A | 9/2002 |
| JP | 2003-502869 A | 1/2003 |
| JP | 2003-502870 A | 1/2003 |
| JP | 2006-105027 A | 4/2006 |
| JP | 2006-303044 A | 11/2006 |
| JP | 2007-173320 A | 7/2007 |
| JP | 2007-227872 A | 9/2007 |
| JP | 2007-315958 A | 12/2007 |
| WO | WO 01/78158 | 10/2001 |
| WO | WO 01/91199 A1 | 11/2001 |
| WO | 0239510 A1 | 5/2002 |

* cited by examiner

PIEZO ACTUATOR WITH EXTERNAL ELECTRODE SOLDERED TO OUTER FACE

This application is a continuation of co-pending International Application No. PCT/EP2009/060676, filed Aug. 18, 2009, which designated the United States and was not published in English, and which claims priority to German Application No. 10 2008 038 227.2, filed Aug. 18, 2008, and German Application No. 10 2008 062 021.1, filed Dec. 12, 2008, which applications are incorporated herein by reference.

BACKGROUND

A piezo actuator is specified, which is formed from a plurality of piezoelectric layers with electrode layers located between them. When an electrical voltage is applied to the electrode layers, the piezoelectric layers expand, resulting in a linear movement being produced. Piezo actuators such as these are used, for example, for operating an injection valve in a motor vehicle.

When the piezo actuator is operated, mechanical stresses can occur, resulting in cracks, in particular also on an external electrode. This can lead to failure of the piezo actuator.

The document EP 0844678 B1 specifies a piezo actuator which has a three-dimensionally structured, electrically conductive electrode which is connected to basic metallization via partial contact points.

SUMMARY

In one aspect, a piezo actuator is specified having an external electrode which can be produced at low cost and is highly reliable.

A multilayer piezo actuator is specified having a stack of piezoelectric layers and electrode layers located between them. The piezo actuator has at least one external electrode for making electrical contact with the electrode layers. The external electrode is in the form of a wire mesh. The external electrode is attached over its entire area to an outer face of the stack.

The piezo actuator is preferably a monolithic multilayer actuator which is produced from thin films of a piezoelectric material, for example, lead zirconate-titanate (PZT). In order to form the electrode layers, a metal paste, for example, a silver-palladium paste or a paste containing copper, can be applied to the films by a screen-printing process. The films are then stacked, compressed and sintered together. This results in a monolithic sintered body, in which all the layers are sintered together. The electrode layers are preferably configured such that they are passed out alternately as far as one side surface of the stack along the stacking direction of the piezo actuator, and are set back with respect to a further side surface. External electrodes can be fitted to the two side surfaces in order to make electrical contact with the electrode layers. The electrode layers are then alternately electrically connected to one of the external electrodes in the stacking direction, and are separated from the second external electrode.

At least one of the external electrodes is a wire mesh which has wires which are woven with one another. When the wire mesh is attached over its entire area, at least those areas of the wires which are adjacent to the outer face of the stack are attached to the outer face of the stack.

In this way, the external electrodes are firmly connected to the piezo actuator, and a reliable contact is made. Furthermore, the attachment of those wire sections which rest on the outer face of the stack prevents relative movement of the wire sections with respect to the outer face, and therefore prevents the wires from chafing on the outer face of the stack.

Those wire sections which are located on a side of the wire mesh which faces the outer face of the stack are preferably firmly connected to the outer face of the stack. In this case, a wire section faces the outer face of the stack when it is directly accessible from the outside of the stack. By way of example, this relates to those wire sections which are routed vertically upward from the outer face of the stack. In particular, there are no further wire sections between a wire section which faces the outer face of the stack and the outer face of the stack.

The wire mesh preferably rests over its entire area on the stack. This has the advantage that contact can be made with the piezo actuator in a particularly space-saving manner. In this case, all the wires are preferably attached to the outer face of the stack.

The preferred weaving of the wires results, however, in mesh nodes, at which one wire is at the top and one wire is at the bottom. When the wire mesh makes contact over its entire area, this is also intended to include the situation in which areas of the wires at the top do not rest directly on the outer face of the stack in the area of mesh nodes. These areas are preferably firmly connected to the wires at the bottom, but need not be attached directly to the outer face of the stack. The wire at the bottom of a mesh node, which rests on the outer face of the stack, is, however, attached directly to the outer face of the stack.

In one preferred embodiment, the external electrode is attached to a basic metallization of the stack. The basic metallization is applied to an outer face of the stack. For example, basic metallizations, to each of which an external electrode is attached, are fitted to two opposite side surfaces of the stack.

The basic metallization preferably has at least one burnt-in metallic paste, or paste containing metal. The burnt-in paste is preferably applied in the form of a layer on the stack.

By way of example, a metal paste such as this can be applied to the outer face of the stack, before the stack is sintered. In this case, the metal paste is burnt in during the sintering of the stack, thus resulting in a so-called co-sintered basic metallization. As an alternative to this, the metal paste can be applied to the outer face after the sintering of the stack, and can be burnt in subsequently. Such basic metallization may also have a plurality of metal pastes applied one on top of the other.

By way of example, a metal paste contains a metal from the group copper and silver. Basic metallization which is burnt in after the sintering of the stack preferably has at least one paste which contains a glass-flux component. When a plurality of metal pastes are applied one on top of the other, at least that metal paste which is directly adjacent to the stack preferably contains a glass-flux component. This allows the basic metallization to adhere with sufficient strength to the stack. A further metal paste can be applied to that layer of the basic metallization which is directly adjacent to the stack. This metal paste preferably does not contain a glass-flux component.

The external electrode is preferably soldered to the basic metallization. For example, a solder material from the group tin, tin alloy, lead or antimony is used in this case. The use of tin as the solder material has the advantage that no materials which are hazardous to health, such as lead or cadmium, need be used, or they need be used only in small amounts. The solder material preferably has a certain elastic deformation capability after soldering. This has the advantage that the solder material is stretched when cracks occur on the outer face of the stack, and the crack can be bridged without tearing immediately.

In order to improve the solderability, the burnt-in basic metallization can be surface-treated.

In one embodiment, a continuous solder layer is located between the external electrode and the basic metallization.

The solder layer preferably covers the area of the basic metallization to which the wire mesh is fitted. This can lead to the basic metallization not being visible from the outside in the area in which the wire mesh is fitted. The wire mesh rests on the solder layer, or is partially or completely immersed in the solder layer. The wire mesh is attached to the stack by means of the solder layer. In the situation in which wires are immersed in the solder layer, they may also be directly adjacent to the outer face of the stack and are enclosed at the side by the solder layer. This situation is also intended to be included here. A continuous solder layer such as this can be applied easily and can be produced at low cost.

In one embodiment, the wires are woven with one another at an angle of 90°. The wires preferably include an angle of 45° with the stacking direction.

This has the advantage that, when a tensile stress occurs along the stacking direction, a wire mesh such as this is subject to less overall expansion than a wire mesh in which wires are arranged along the stacking direction. By way of example, a tensile stress occurs when cracks are created at right angles to the stacking direction of the actuator. For example, the stacking direction of the actuator also corresponds to the linear movement direction. In this situation, the wire mesh is less stressed even during normal operation of the piezo actuator, ensuring that a reliable contact is made.

In one embodiment, the wire mesh has wires with a conductive carrier material.

In this case, the carrier material forms the basic structure of the wires. A coating can be applied to this carrier material in order to improve the solderability or the electrical conductivity of the wire mesh.

By way of example, the carrier material contains a metal, for example, steel, copper or a copper alloy, or an electrically conductive polymer. In particular, the carrier material may also be composed of one or more of these materials.

By way of example, the coating contains at least one metal from the group copper and tin. The wires preferably contain steel and are at least partially coated with one or more metals from the group copper and tin, thus making it possible to achieve a good wetting capability with solder.

In one alternative embodiment, the wire mesh has wires with an insulating carrier material. By way of example, the carrier material contains an insulating polymer or an insulating material such as wood. In the case of wires composed of non-conductive basic materials, adequate conductivity can be achieved by a metallic coating.

The carrier material of the wires is preferably elastic.

This has the advantage that, when mechanically loaded, the wires deform elastically and there is less probability of cracks developing in the wires. For example, a mechanical load occurs when there is a crack on the outer face of the stack to which the wire mesh is attached. If the wires are elastic, then they stretch and can bridge the gap.

In one embodiment, the external electrode is in the form of a wire mesh which comprises a plurality of layers, with a bottom layer being adjacent to the outer face of the stack. This bottom layer is attached over its entire area to the outer face of the stack.

In the case of a multilayer wire mesh, the reliability of the external electrode is increased, and the probability of a crack which passes through the external electrode occurring is reduced. The wire mesh may be formed from two layers. The upper layer is preferably soldered to the lower layer.

By way of example, the multilayer wire mesh is produced by folding a wire mesh. In order to produce a two-layer wire mesh, a single-layer wire mesh can be folded inward from two opposite longitudinal sides, such that the longitudinal sides meet in the center of the wire mesh. The edges of the longitudinal sides can then be soldered to one another.

A method is also specified for fitting an external electrode to a piezo actuator. In this case, a stack of piezoelectric layers and electrode layers located between them are provided. Basic metallization is applied to one outer face of the stack and is burnt in. By way of example, the basic metallization may be burnt in during or after a sintering process.

Furthermore, a wire mesh is provided. The wire mesh is coated with solder material. For example, a solder material such as tin, a tin alloy, antimony or lead is applied by electrochemical deposition to the wire mesh. The wire mesh is then placed on the basic metallization and is heated, such that the solder material melts and the wire mesh is soldered to the basic metallization.

The amount of solder material used is preferably in this case chosen such that the wire mesh can be soldered over its entire area to the basic metallization. On the other hand, the amount of solder material must not be too great either, in order not to adversely affect the functionality of the actuator.

In one embodiment, the mesh is pressed onto the basic metallization during the soldering process. This has the advantage that the mesh is immersed to a greater extent into the solder layer during the soldering process, and a more robust connection can be produced. Furthermore, pressing on results in the wire mesh being soldered over its entire area to the basic metallization more reliably. In order to ensure that the wire mesh is soldered over its entire area, the contact pressure must be matched to the further process parameters, for example the nature and amount of the solder material used, the temperature during the soldering process and the nature of the wire mesh. Furthermore, pressing on makes it possible to ensure that the mesh is resting closely on the side surface of the actuator, thus allowing contact to be made in a space-saving manner.

BRIEF DESCRIPTION OF THE DRAWINGS

The specified piezo actuator and its advantageous refinements will be explained in the following text with reference to schematic figures, which are not to scale, and in which.

Figure 1:
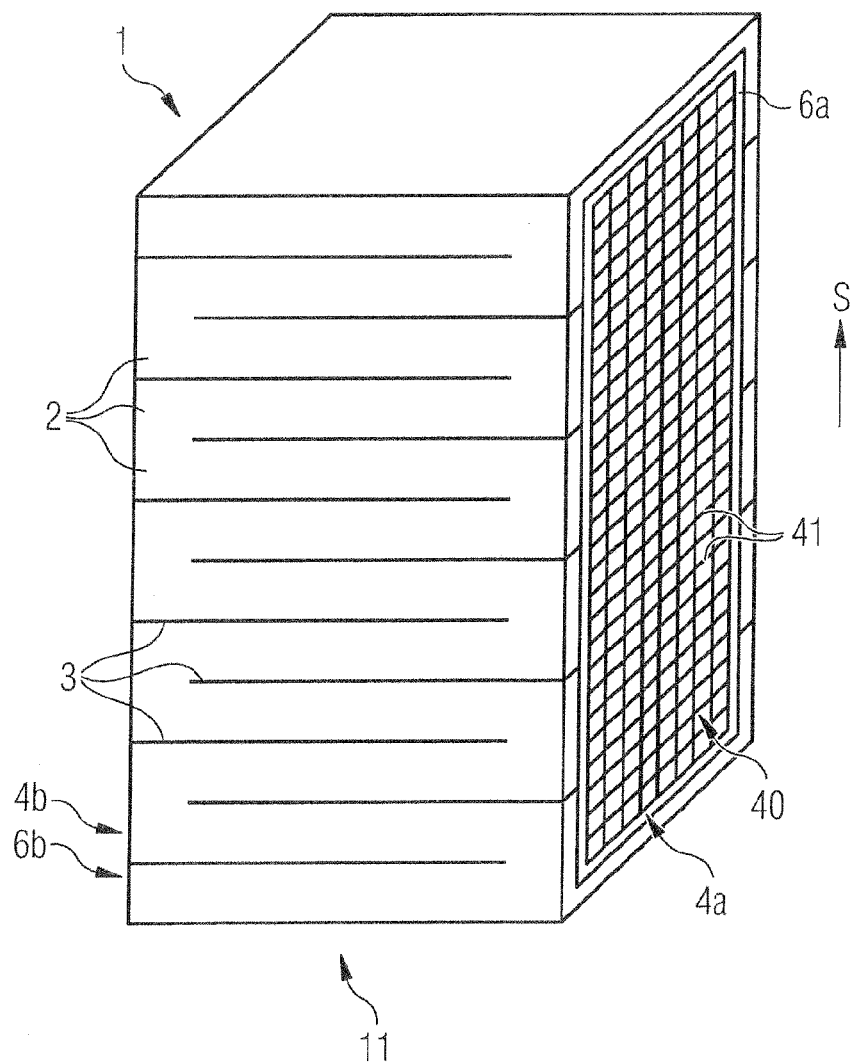
FIG. 1 shows a perspective view of a piezo actuator.

The following list of reference symbols can be used in conjunction with the drawings:
1 Piezo actuator
11 Stack
2 Piezoelectric layer
3 Electrode layer
4a, 4b External electrode
40 Wire mesh
41, 41a, 41b, 41c, 41d, 41e, 41f Wire
42a, 42b Free end
43 Mesh node
5a, 5b Solder layer
6a, 6b Basic metallization
7 Connecting wire
S Stacking direction

DETAILED DESCRIPTION OF ILLUSTRATIVE EMBODIMENTS

FIG. 1 shows a multilayer piezo actuator 1 in which a plurality of piezoelectric layers 2, for example, ceramic layers, are arranged along a stacking direction S to form a stack 11. The stacking direction S corresponds to a longitudinal direction of the piezo actuator 1. Electrode layers 3 are arranged between the piezoelectric layers 2. External electrodes 4a, 4b, which are each in the form of a wire mesh 40, are fitted to two side surfaces of the stack 11, and wires 41 coated with copper and composed of a carrier material of steel are welded with one another in the wire mesh 40. The external electrodes 4a, 4b are soldered over their entire area to basic metallizations 6a, 6b on two opposite side surfaces of the stack 11.

Figure 2:
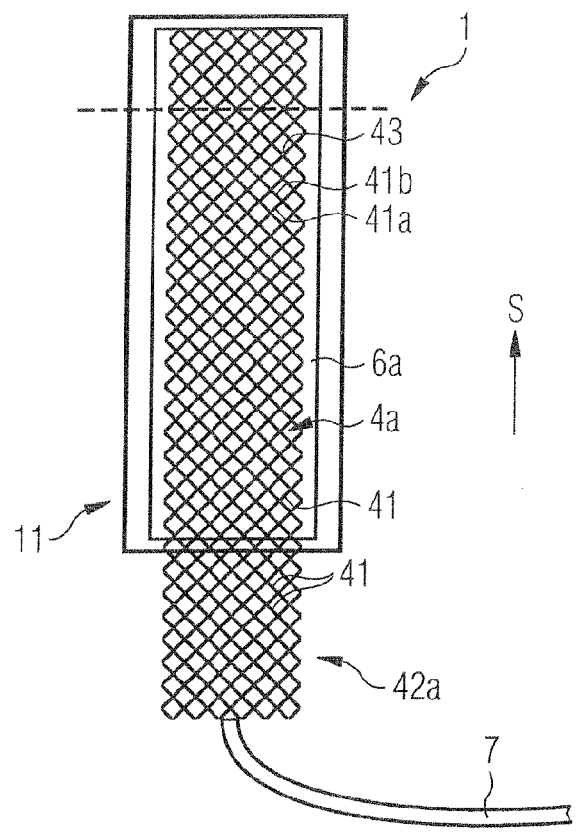
FIG. 2 shows a side view of a piezo actuator.

FIG. 2 shows a piezo actuator 1 with an external electrode 4a in the form of a wire mesh 40. The wires 41a, 41b in the wire mesh 40 are woven with one another at an angle of 90°, and each include an angle of 45° with the stacking direction S. This results in less load on the wires when a tensile stress is applied in the stacking direction S than if the wires were to be arranged along the stacking direction S. The wires 41a, 41b are woven with one another, such that one wire 41a is located at the bottom and one wire 41b at the top at a mesh node 43. The respective wire 41a, 41b rests alternately on the top and bottom of the mesh node along a wire 41a, 41b.

In this case, a free end 42a of the external electrode 4a projects beyond the stack 11 along the stacking direction S. A connecting wire 7 is attached to the free end 42a. The connecting wire is, for example, soldered or welded to the free end 42a of the external electrode 4a. As an alternative to this, as shown in FIG. 1, the external electrode 4a may end within the side surface of the stack 11. The connecting wire 7 can also be soldered on in an area of the external electrode 41a, and is attached to the outer face of the stack 11.

Figure 3:
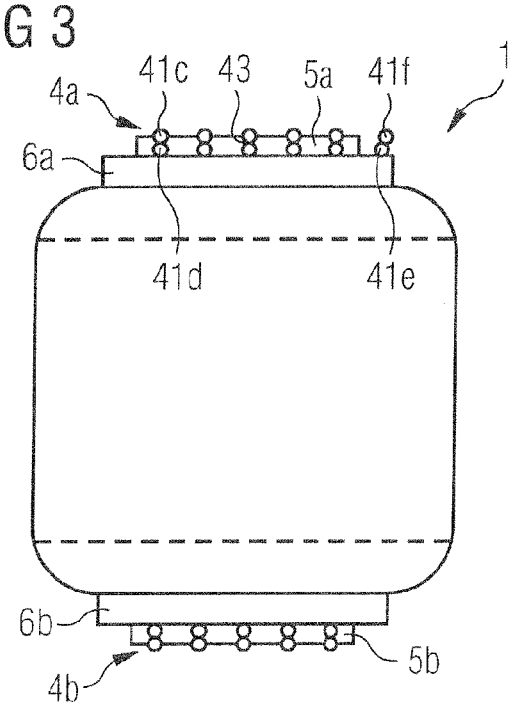
FIG. 3 shows a cross section through a piezo actuator, at right angles to the stacking direction.

FIG. 3 shows a cross section through a piezo actuator 1 as shown in FIG. 2, at right angles to the stacking direction S. In this case, the cross section runs along the dashed line indicated in FIG. 2, and crosses mesh nodes 43 of the wire mesh 40. The section drawing shows basic metallizations 6a, 6b, which are fitted to two mutually opposite side surfaces of the piezo actuator 1. The external electrodes 4a, 4b are attached to the basic metallizations 6a, 6b over their entire area by means of a solder layer 5a, 5b.

The external electrodes 4a, 4b are connected over their entire area to the side surfaces of the stack 11. In particular, the wire sections which face the outer face of the stack 11 are attached directly to the stack 11. Two wires cross at each of the mesh nodes 43, with one of the wires 41c being located at the top, and the further wire 41d at the bottom. The wire 41d which is located at the bottom in this case makes direct mechanical contact with the basic metallization 6a, and is surrounded at the side by the solder layer 5a. The solder layer 5a covers the area of the basic metallization 6a in the sense that it is interrupted only by wires 41b. The basic metallization 6a therefore cannot be seen from the outside in the area of the external electrode 4a, since it is covered by the solder layer 5a and the external electrode 4a. In this case, the upper wires 41c are likewise attached directly to the stack 11 by means of the solder layer 5a. As an alternative to this, however, they can also be attached only to the lower wires 41b. The important factor is that the wire sections which are adjacent to the outer face of the stack 11 are attached directly to the stack 11. In this case, the solder material may be located between the wires and the outer face of the stack 11, or may adhere to the wires at the side. The solder material need not be in the form of a continuous solder layer 5a, as shown here, but it is sufficient for the solder material to have a shape which ensures that the wire mesh 40 is attached over its entire area to the stack 11.

Attachment over the entire area is, however, also intended to include the situation in which individual wires which, for example, are located at the side edge of the wire mesh 40, are not attached to the outer face of the stack 11. One such wire 41e can also be seen in FIG. 3. This wire 41e is the lower wire of a mesh node 43 and is adjacent to the stack 11. It is located outside the solder layer 5a, and is not attached to the outer face of the stack 11. The wire 41f located at the top is also not attached to the outer face of the stack, but is only connected to the lower wire 41e by means of a soldered joint (not shown).

Figure 4:
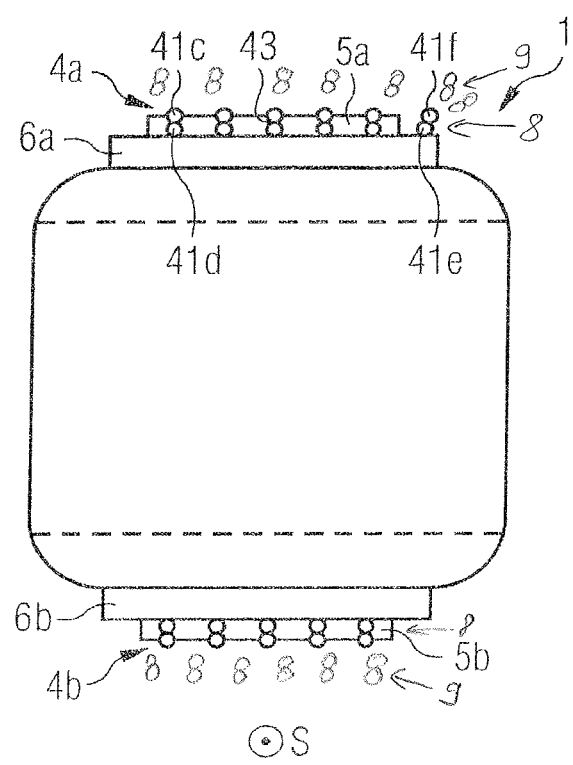
FIG. 4 shows a cross section through another embodiment piezo actuator.

FIG. 4 shows another embodiment with a wire mesh 40 being folded. The wire mesh 40 comprises a two-layer wire mesh with a lower layer 8 and an upper layer 9. In order to produce the two-layer wire mesh 40, a single-layer wire mesh can be folded inward from two opposite longitudinal sides, such that the longitudinal sides meet in the center of the wire mesh.

The description of the invention based on the exemplary embodiments does not restrict the invention thereto, and the invention covers any novel feature and any combination of features. In particular, this includes any combination of features in the patent claims, even if this feature or this combination is not itself explicitly stated in the patent claims or exemplary embodiments.

What is claimed is:

1. A multilayer piezo actuator comprising:
   a stack of piezoelectric layers and electrode layers located between the piezoelectric layers;
   an external electrode electrically contacting electrode layers, the external electrode being in the form of a wire mesh, wherein the mesh is folded and comprises an upper layer and a lower layer, wherein the upper layer is soldered to the lower layer; and
   a basic metallization on an outer surface of the stack, wherein the entire area of the lower layer is soldered to the basic metallization on the outer surface of the stack and wherein all sections of the lower layer of the wire mesh facing the basic metallization lie on solder material or are at least partially embedded in solder material.

2. The piezo actuator according to claim 1, wherein the wire mesh comprises mesh nodes with a wire located at the top and a wire located at the bottom.

3. The piezo actuator according to claim 2, wherein the wire located at the bottom is attached to the outer face of the stack at the mesh node.

4. The piezo actuator according to claim 1, wherein the wire mesh comprises wires with a conductive carrier material.

5. The piezo actuator according to claim 4, wherein the carrier material includes a material selected from the group consisting of steel, copper and a copper alloy.

6. The piezo actuator according to claim 1, wherein the wire mesh comprises wires with an insulating carrier material.

7. The piezo actuator according to claim 6, wherein the carrier material is elastic.

8. The piezo actuator according to claim 1, wherein the wire mesh comprises wires that are provided with a conductive coating.

9. The piezo actuator according to claim 8, wherein the conductive coating contains at least one metal selected from the group consisting of copper and tin.

10. The piezo actuator according to claim 1, wherein the wire mesh comprises wires that are woven with one another at an angle of 90°.

11. The piezo actuator according to claim 10, wherein the wires that are woven with one another include an angle of 45° with a stacking direction of the stack.

12. The piezo actuator according to claim 1, wherein the basic metallization has at least one burnt-in metal paste.

13. The piezo actuator according to claim 1, wherein the basic metallization is surface-treated in order to improve the solderability.

14. The piezo actuator according to claim 1, wherein a continuous solder layer is located between the external electrode and the basic metallization.

15. The piezo actuator according to claim 1, further comprising a second outer electrode soldered to another face of the stack.

16. A multilayer piezo actuator comprising:
a stack of piezoelectric layers and electrode layers located between the piezoelectric layers;
an external electrode electrically contacting electrode layers, the external electrode being in the form of a wire mesh, wherein the wire mesh is folded inward from two opposite longitudinal sides, wherein the folded wire mesh comprises an upper layer and a lower layer, wherein edges of the longitudinal sides of the wire mesh are soldered to one another; and
a basic metallization on an outer surface of the stack, wherein the entire area of the lower layer is soldered to the basic metallization on the outer surface of the stack, and wherein all sections of the lower layer of the wire mesh facing the basic metallization lie on solder material or are at least partially embedded in solder material.

* * * * *